United States Patent
Ishino et al.

(10) Patent No.: US 6,507,139 B1
(45) Date of Patent: Jan. 14, 2003

(54) APPARATUS HAVING AN ELECTRONIC COMPONENT LOCATED ON A SURFACE OF A PACKAGE MEMBER WITH A SPACE THEREBETWEEN

(75) Inventors: Satoshi Ishino, Kusatsu (JP); Kenji Kubota, Sabae (JP); Tsuyoshi Saito, Fukui (JP); Michinobu Maesaka, Omihachiman (JP); Mamoru Ogawa, Moriyama (JP); Jiro Inoue, Omihachiman (JP); Hiroaki Kaida, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/109,333

(22) Filed: Jun. 30, 1998

(30) Foreign Application Priority Data

Jun. 30, 1997 (JP) .............................................. 9-174837

(51) Int. Cl.⁷ .............................................. H01L 41/08
(52) U.S. Cl. ........................................ 310/348; 310/344
(58) Field of Search ................................ 310/340, 344, 310/348, 351–353

(56) References Cited

U.S. PATENT DOCUMENTS

| 3,073,975 | A | * | 1/1963 | Bigler et al. ............ 310/348 X |
| 3,735,166 | A | * | 5/1973 | Bradley ...................... 310/352 |
| 4,033,017 | A | * | 7/1977 | Watanabe et al. ........... 310/348 |
| 4,035,673 | A | * | 7/1977 | Ishida et al. ................. 310/344 |
| 4,583,019 | A | * | 4/1986 | Yamada et al. ......... 310/348 X |
| 5,459,368 | A | * | 10/1995 | Onishi et al. ........... 310/313 R |
| 5,525,855 | A | * | 6/1996 | Gotoh et al. ............ 310/348 X |
| 5,699,027 | A | * | 12/1997 | Tsuji et al. ............. 310/348 X |
| 5,801,474 | A | * | 9/1998 | Sakairi .................... 310/348 X |
| 5,920,242 | A | * | 7/1999 | Oya et al. ............... 310/352 X |
| 6,078,123 | A | * | 6/2000 | Tanaha et al. .......... 310/344 X |

FOREIGN PATENT DOCUMENTS

| JP | 3-112191 | 5/1991 |
| JP | 5-83074 | 4/1993 |
| JP | 8-88470 | 4/1996 |
| JP | 9-283650 | 10/1997 |
| JP | 10-215074 | 8/1998 |

* cited by examiner

Primary Examiner—Mark O. Budd
(74) Attorney, Agent, or Firm—Keating & Bennett, LLP

(57) ABSTRACT

An electronic component includes a package member; a via hole electrode extending through the package member and protruding from a first surface of the package member; an electronic component located on the first surface of the package member with a space located between the package member and the electronic component. The space between the electronic component and the first surface of the package member is provided by a protruding portion of the via hole electrode which extends from the surface of the package member and a joining member joining the electronic component with the via hole electrode.

12 Claims, 12 Drawing Sheets

APPARATUS HAVING AN ELECTRONIC COMPONENT LOCATED ON A SURFACE OF A PACKAGE MEMBER WITH A SPACE THEREBETWEEN

BACKGROUND OF THE INVENTION

1. Field of the Invention

The present invention relates to an apparatus, such as a piezoelectric resonance device, having an electronic component located on a surface of a package member with a space provided between the electronic component and the package member.

2. Description of the Related Art

Some electronic devices require that a portion thereof does not contact a printed circuit board or substrate when mounted on the printed circuit board or substrate or the like. For instance, in a piezoelectric resonator, a resonating section thereof must be arranged such that a sufficient space between the resonating section and the printed circuit substrate is provided in order to prevent interference with the oscillation of the resonating section. In case of an exothermic electronic component, it is necessary to mount the electronic component such that a sufficient space between the printed circuit board or substrate and the component is provided in order to prevent heat from conducting to the printed circuit board or substrate and other nearby elements.

Various structures have been proposed for a piezoelectric resonator in order to create such a space.

FIG. 17 is a partially cutaway section view showing one example of a prior art structure for mounting a piezoelectric resonator.

As seen in FIG. 17, electrode lands 52a and 52b are located on a substrate 51. A piezoelectric resonator 53 is mounted in contact with the electrode lands 52a and 52b. The piezoelectric resonator 53 has a structure in which a terminal electrode 53b is located at one end of a piezoelectric plate 53a and a terminal electrode 53c is located at the other end. It is noted that a resonance electrode not shown is connected to the terminal electrodes 53b and 53c.

The terminal electrodes 53b and 53c are connected to the electrode lands 52a and 52b via conductive adhesives 54a and 54b applied so as to have a certain thickness to prevent interference with the oscillation of a resonating section of the resonator 53.

That is, a gap 55 is created between the piezoelectric resonator 53 and an upper surface 51a of the substrate 51 by increasing a thickness of the conductive adhesives 54a and 54b.

However, because the conductive adhesives 54a and 54b are liquid when they are applied, the conductive adhesive material is liable to flow along the upper surface 51a toward the center of the piezoelectric resonator 53 as shown by arrows $A_1$ and $A_2$ in FIG. 17. As a result, the resonating section is joined to the upper surface 51a of the substrate 51 via the conductive adhesive in the mounting structure, thereby degrading the resonating characteristics of the resonator 53. In addition, because the conductive adhesives 54a, 54b flow and extend along the upper surface 51a, the vertical dimension of the gap 55 is reduced and cannot be accurately or reliably provided.

Further, because the liquid conductive adhesives 54a and 54b are hardened after the application, the size and vertical dimension of the space 55 varies. Often, the resonating section of the resonator 53 contacts the upper surface 51a of the substrate 51, thereby damaging the resonating characteristics of the resonator 53.

In order to eliminate the aforementioned problems, there has been proposed a mounting structure in which spacers 56a and 56b are interposed between the terminal electrodes 53b and 53c and the electrode lands 52a and 52b as shown in FIG. 18. The spacers 56a and 56b are made of an electrically conductive material such as metal and are joined to the terminal electrodes 53b and 53c as well as the electrode lands 52a and 52b via conductive adhesive or solder. A space 55A is defined between the piezoelectric resonator 53 and the upper surface 51a of the substrate 51 by the vertical dimension of the spacers 56a and 56b.

However, this structure requires preparation of spacers 56a and 56b having a very accurate size and shape and also requires a difficult and time-consuming process of applying the spacers 56a and 56b to mount the piezoelectric resonator 53.

Meanwhile, there has been disclosed a small package structure for storing a piezoelectric resonator and the like in Japanese Patent Laid-Open No. Hei. 5-83074. FIGS. 19a and 19b are a partially cutaway plan view and a section view, respectively, showing the package structure of this prior art device.

The electronic component 61 includes an insulating substrate 62 and a cap 63. A piezoelectric resonator 64 is stored within the package. Further, through hole electrodes 65a–65c are formed so as to extend through the substrate 62. The through hole electrodes 65a–65c are constructed by creating through holes extending through the substrate 62 and by applying an electrode material on the inner peripheral surfaces of the through holes. The inner peripheral surfaces of the through holes and the electrodes extend to the upper and lower surfaces so as to form flange-like portions.

The piezoelectric resonator 64 is joined to the through hole electrodes 65a–65c via conductive adhesives 66a–66c. The conductive adhesives 66a–66c are disposed in the through hole electrodes 65a–65c and are joined to the flange-like portion at the upper surface of the substrate 62 of the through hole electrodes 65a–65c.

It is thought that the electronic component 61 allows an area outside of the cap 63 to be reduced so that the device can be miniaturized because the piezoelectric resonator 64 is led to the outside via the through hole electrodes 65a–65c.

However, because the piezoelectric resonator 64 is joined to the through hole electrodes 65a–65c via the conductive adhesives 66a–66c in the electronic component 61, oscillation of the resonating section is damaged by the conductive adhesives 66a–66c which flow and spread during application thereof similar to the case of the mounting structure 51 shown in FIG. 17. In addition, similar to the prior art device shown in FIG. 17, the prior art device in FIG. 19(b) experiences a problem of not being able to reliably provide an accurate vertical dimension of the gap between the resonator 64 and the substrate 62, which problem is caused by the upper portions of the electrodes 65a–65c and the adhesives 66a–66c extending along and spreading out along the upper surface of the substrate 62.

As described above, there have been problems with degrading resonance characteristics caused by the mounting structure 51 shown in FIG. 17 and by the electronic component 61 shown in FIG. 19 because the space having a sufficient size or vertical dimension cannot be reliably provided due to the fluidity and spreading of the conductive adhesive.

Further, the mounting structure shown in FIG. 18 has had problems with the manufacturing and assembly process being complicated and costly because the spacers 56a and 56b have to be used.

SUMMARY OF THE INVENTION

To overcome the problems described above, the preferred embodiments of the present invention provide an apparatus including an electronic component which is arranged and constructed to be fixed firmly to a package member with a space being reliably provided therebetween and to allow the component to be easily manufactured.

The preferred embodiments of the present invention provide an electronic component including a package member; a via hole electrode provided so as to extend through the package member and to protrude from a first surface of the package member; an electronic component located on the first surface of the package member with a space defined therebetween; the space between the electronic component and the first surface of the package member being determined by a protruding portion of the via hole electrode extending from the surface of the package member; and a joining member joining the electronic component with the via hole electrode.

It is noted that the via hole electrode described in the present specification is intended to mean a solid electrode in which an electrode material is filled completely within a through hole as described later.

It is also noted that the via hole electrode does not extend along an upper or first surface of the substrate or package member as in the prior art. Instead, the via hole electrode extends vertically upwardly from the first surface of the substrate or package.

Also, the via hole electrode is a completely solid member having a rod-shaped configuration such that the rod-shaped member extends through the via hole and has an upper, rounded portion which extends vertically from the upper surface of the substrate or package member in a direction that is substantially perpendicular to the upper surface of the substrate or package member so as to support the resonator and to provide an accurate vertical dimension of the gap between the resonator and the package member.

With the structure of the preferred embodiments of the present invention as described above, a space having a desired size or vertical dimension can be reliably provided between the electronic component and the package member. Accordingly, it becomes possible to provide an electronic component such as a piezoelectric resonator which is mounted on the package member while reliably providing a sufficient space therebetween so that oscillation of the resonating section of the resonator is not hindered.

In addition, although the desired space in the prior art devices could not be obtained due to the fluidity and spreading of the adhesive during application thereof in which the space between the electronic component and the package member is created by the conductive adhesive, a space having a sufficient vertical dimension is reliably provided in the preferred embodiments of the present invention because of the shape and arrangement of the via hole electrodes and protruding portions of the via hole electrodes. Further, because the preferred embodiments of the present invention do not require an extra member such as a spacer to create the space having the desired vertical dimension, the electronic component of the preferred embodiments of the present invention is much easier and less expensive to manufacture. In addition, the rod-shaped, solid via hole electrode filling the via holes in the substrate in the preferred embodiments of the present invention allow for significantly less adhesive to be used as compared to the prior art devices in which adhesive spread along the upper surface of the substrate and in some devices, the adhesive spread into the via holes. Thus, even if the adhesive used in the preferred embodiments of the present invention spreads along the upper surface of the substrate, the gap between the resonator and the substrate is accurately and reliably provided with an exact vertical dimension because of the rod-shaped, solid via hole electrodes.

In the above described apparatus, the electronic component may be a piezoelectric resonator.

With the structure of the preferred embodiments of the present invention, an electronic component having excellent resonance characteristics is obtained.

In the above described electronic component, the via hole electrode may be exposed at a second surface of the package member wherein the first and the second surfaces of the package member are opposed to each other.

By the above-described structure, the electronic component at the upper surface (the first surface) of the package member may be electrically connected with the lower surface (the second surface) of the package member by using the via hole electrodes. Accordingly, this arrangement allows the electronic component which can be readily mounted on the package member surface to be obtained by forming connecting electrodes and terminal electrodes on the lower surface of the package member.

In the above described electronic component, the package member may comprise a ceramic substrate and a plurality of internal electrodes may be provided in the package member so as to form at least one capacitor, and the via hole electrode may be electrically connected to the capacitor.

With the above described structure, an electronic apparatus includes a complex type package structure having a circuit in which the capacitors are connected to the electronic component mounted on the package member.

In the above described electronic component, the package member may comprise a ceramic substrate, a plurality of cutaways may be provided on a side of the ceramic substrate, and a plurality of external electrodes may be provided in the plurality of cutaways.

With the above described structure, it becomes possible to form the external electrodes readily by using the same method as that used for forming the via hole electrodes and to provide a smaller electronic component as compared to the external electrode using the through hole electrodes.

According to another preferred embodiment of the present invention, a method of forming the apparatus includes the steps of laminating a plurality of ceramic green sheets on a support film to obtain a ceramic green sheet laminate, forming through holes through the ceramic green sheet laminate at positions where via hole electrodes are to be located, applying conductive material into the through holes so as to fill the through holes and to be located on the upper surface of the ceramic green sheet laminate to form via hole electrodes, and sintering the ceramic green sheet laminate to form a substrate and so as to form protrusion portions of the via hole electrodes which protrude upward from the upper surface of the substrate.

The via hole electrodes that are formed by the above process are solid and substantially rod-shaped. The via hole electrodes formed by the above process fill the via holes with the solid, rod-shaped configuration. The protruding portions are formed because a coefficient of thermal contraction of the ceramics, during cooling after the sintering, is higher as compared to a coefficient of thermal contraction of the electrode material.

As a result of the protruding portions of the via hole electrodes, a gap having a sufficient size or vertical dimension can be reliably created below the piezoelectric resonator and the substrate.

In a further preferred embodiment, the method includes the step of setting the coefficient of thermal contraction of the ceramics to be higher than the coefficient of thermal contraction of the electrode material filled in the through holes by about 1% to about 20%. With this desired range, the size of the gap is accurately and reliably achieved.

Other features and advantages of the present invention will become apparent from the following description of the present invention which refers to the accompanying drawings.

DETAILED DESCRIPTION OF PREFERRED EMBODIMENTS

Figure 1:
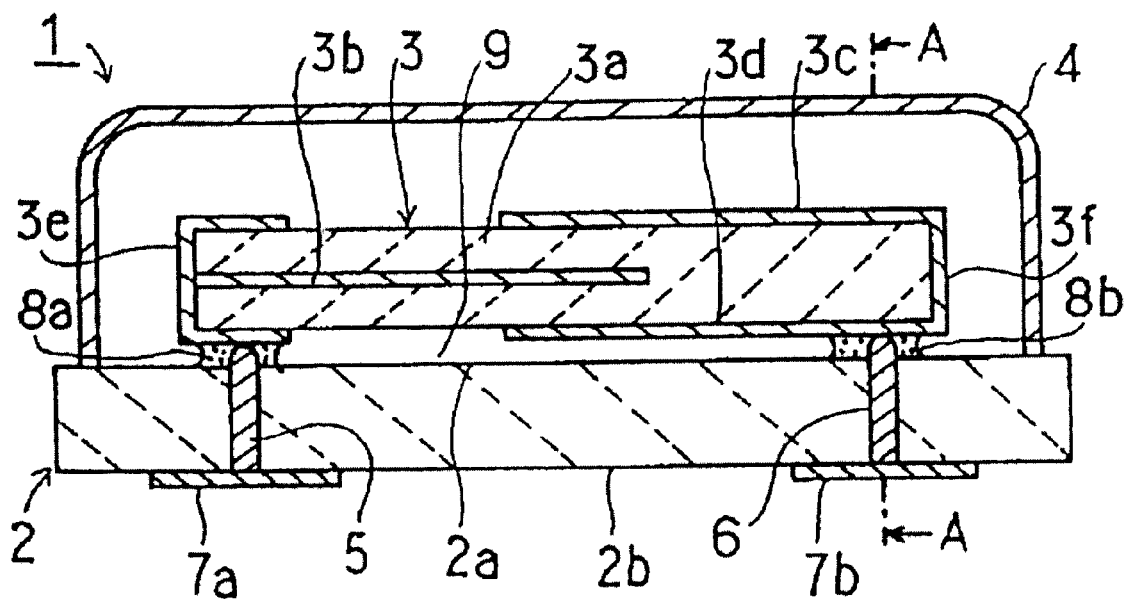
FIG. 1 is a longitudinal section view showing an electronic component according to a first preferred embodiment of the present invention.
Figure 2:
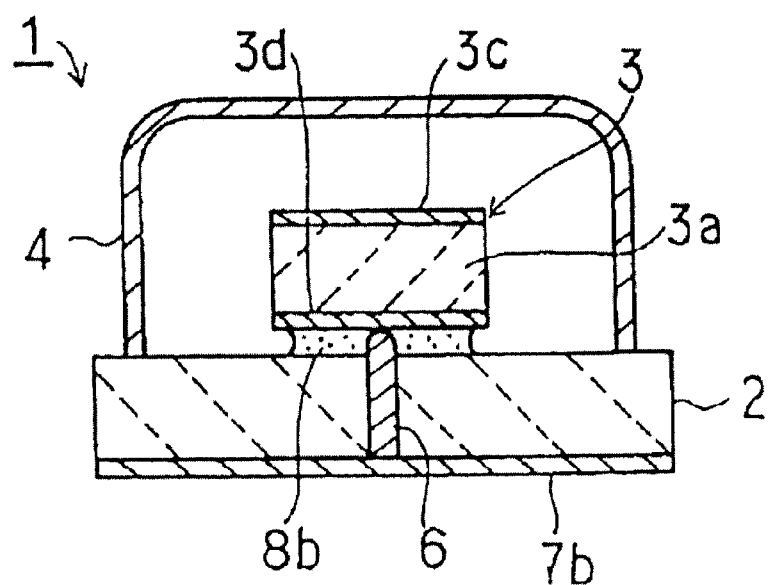
FIG. 2 is a transverse section view of the electronic component shown in FIG. 1 along a line A—A in FIG. 1.

FIGS. 1 and 2 are frontal and side section views showing an electronic component according to a first preferred embodiment of the present invention.

In the electronic component 1 shown in FIG. 1, a piezoelectric resonator 3 is mounted on a substrate 2 in a package arrangement. Further, a cap 4 preferably made of a metal is fixed to the substrate 2 so as to surround the piezoelectric resonator 3. The cap 4 is arranged so as to create an internal space in which the piezoelectric resonator 3 is stored. The internal space inside of the cap 4 is defined by the cap 4 having a substantially U-shape which is arranged so that the open portion thereof faces downward and is fixed to the upper surface of the substrate 2 via adhesive (not shown).

The substrate 2 is preferably made of insulating ceramics such as alumina. Via hole electrodes 5 and 6 are formed to extend through the substrate 2.

As seen in FIG. 1, the via hole electrodes preferably comprise solid, rod-shaped members which are arranged to penetrate through the substrate 2 such that protruding portions at the upper ends of the via hole electrodes 5, 6 protrude upward from the upper surface 2a of the substrate 2. It is important to note that the protruding portions of the via hole electrodes 5, 6 do not extend along the upper surface of the substrate 2 but instead extend vertically from the upper surface of the substrate 2 in a direction that is substantially perpendicular to the upper surface of the substrate 2. Lower surfaces of the via hole electrodes 5 and 6 are exposed at a lower surface 2b of the substrate 2 and are connected to terminal electrodes 7a and 7b disposed on the lower surface 2b of the substrate 2.

The piezoelectric resonator 3 is constructed by using a piezoelectric member 3a formed of piezoelectric ceramics such as titanate piezoelectric ceramics. The piezoelectric member 3a is polarized in the thickness direction and has an internal electrode 3b. Further, electrodes 3c and 3d are located on the upper and lower surfaces of the piezoelectric member 3a so that the electrodes 3c, 3d overlap with the internal electrode 3b at an approximately central region of the piezoelectric member 3a. The internal electrode 3b is located at one end of the piezoelectric resonator 3 and is electrically connected to a terminal electrode 3e which extends to the bottom surface of the piezoelectric member 3a. The electrodes 3c and 3d are electrically connected to each other by a terminal electrode 3f located at the other end of the piezoelectric member 3a.

The piezoelectric resonator 3 is preferably an energy trap piezoelectric resonator utilizing a thickness longitudinal oscillation mode and is driven when AC voltage is applied between the terminal electrodes 3e and 3f. The piezoelectric resonator 3 is located on the portion of the via hole electrodes 5 and 6 which protrudes from the upper surface 2a of the substrate 2 and is fixed thereto by conductive adhesives 8a and 8b on the substrate 2.

Because the upper ends of the via hole electrodes 5 and 6 protrude upward from the upper surface 2a of the substrate 2 as described above, a space 9 having a size or vertical dimension that is sufficient to prevent interference with the resonance of a resonating section is reliably provided between the lower surface of the piezoelectric resonator 3 and the upper surface 2a of the substrate 2. That is, the present preferred embodiment is characterized in that the via hole electrodes 5 and 6 are provided so as to extend through the substrate 2, the upper ends of the via hole electrodes 5 and 6 protrude upward from the upper surface 2a and the piezoelectric resonator 3 is arranged such that a space having a vertical dimension corresponding to the protrusion of the via hole electrodes 5 and 6 is defined between the substrate 2 and the resonator 3.

The via hole electrodes 5 and 6 are preferably constructed by filling an electrode material in the through holes created through the substrate 2. The upper protrusion of the via hole electrodes 5 and 6 is preferably created by the following fabrication method.

That is, before obtaining the substrate 2, a plurality of ceramic green sheets are laminated on a support film to obtain a ceramic green sheet laminate. Next, through holes are created through the ceramic green sheet laminate at the portions where the via hole electrodes 5 and 6 are to be located. Next, a squeegee step is performed from above the ceramic green sheet laminate supported by the support film to deposit the liquid or slurry conductive material such as conductive paste into the through holes. Because the through holes are filled with the conductive material via the squeegee, the upper surface of the electrode material filled in the through holes is shared with the upper surface of the ceramic green sheet laminate.

However, when the ceramic green sheet laminate described above is sintered to obtain the substrate 2, the protrusion portions which protrude upward from the upper surface 2a of the substrate 2 are created above the via hole electrodes 5 and 6 as shown in FIG. 1 because a coefficient of thermal contraction of the ceramics, during cooling after the sintering, is higher as compared to a coefficient of thermal contraction of the electrode material, i.e. the coefficient of thermal contraction of the electrode material is smaller.

It has been discovered that the space 9 having a sufficient size or vertical dimension can be reliably created below the piezoelectric resonator 3 by setting the coefficient of thermal contraction of the ceramics to be higher than the coefficient of thermal contraction of the electrode material filled in the through holes by about 1% to about 20%. It is noted that when the difference of the coefficients of thermal contraction described above is less than about 1%, the height of the protrusion portion of the via hole electrodes 5 and 6 becomes insufficient to reliably provide a space 9 that has a size or vertical dimension which allows for unhindered vibration of the resonator 3. When the difference in coefficients of thermal contraction described above exceeds about 20%, the protrusion portion of the via hole electrodes 5 and 6 becomes too high, thus causing the piezoelectric resonator 3 to become unstable which makes it difficult to stably and accurately perform adhering steps using the conductive adhesives 8a and 8b and negatively affecting the resonator characteristics. It also makes it difficult to reduce the size and vertical height of the electronic component 1.

Figure 3:
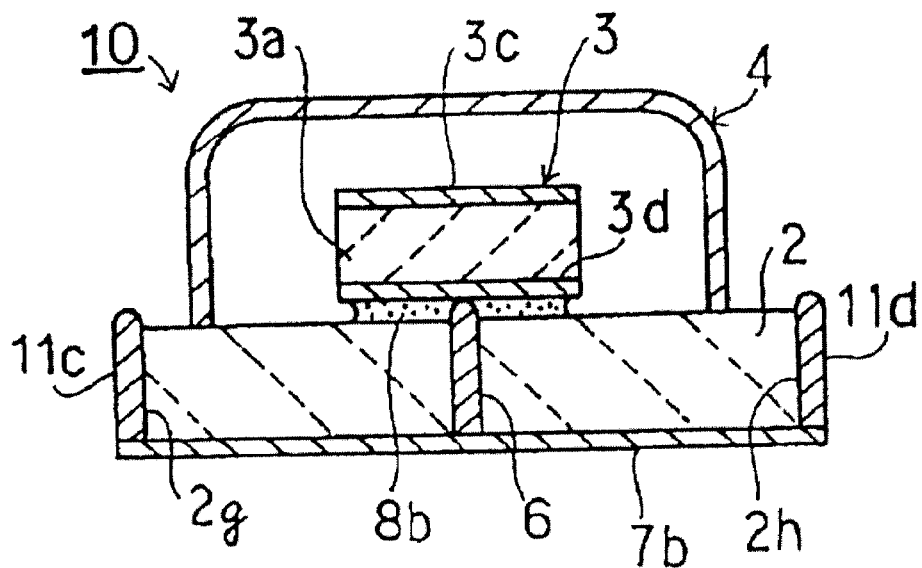
FIG. 3 is a transverse section view illustrating an electronic component according to a second preferred embodiment of the present invention.
Figure 4:
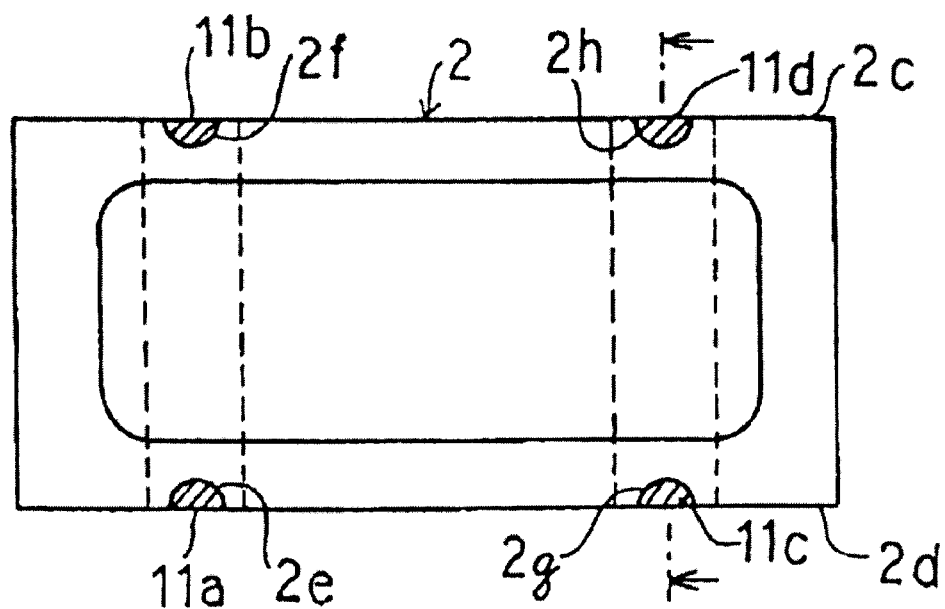
FIG. 4 is a plan view of the electronic component shown in FIG. 3.

FIGS. 3 and 4 are section and plan views for explaining a second preferred embodiment of the present invention.

FIG. 3 corresponds to FIG. 2 shown for the first preferred embodiment.

An electronic component 10 of the second preferred embodiment is characterized in that electronic components 11a, 11b, 11c and 11d which are preferably formed by the same method described above have via hole electrodes 5 and 6 formed on the sides of the substrate 2. The other features are preferably the same as the electronic component 1 of the first preferred embodiment.

That is, the electronic components 11a, 11b, 11c and 11d are preferably formed by completely filling the electrode material within preferably substantially semicircular (in plan view) cutaways 2e through 2h formed in side surfaces 2c and 2d of the substrate 2. That is, the electrode material composing the external electrodes 11a through 11d is applied so as to almost fill the cutaways 2e through 2h and so as not to reach the upper and lower surfaces of the substrate 2.

The external electrodes 11a through 11d are preferably formed at the same time that the via hole electrodes 5 and 6 are formed. That is, a mother substrate for obtaining a plurality of substrates 2 is prepared, substantially circular through holes having a size (in plan view) that is about twice that of the cutaways 2e through 2h are created at the positions corresponding to the cutaways 2e through 2h on the mother substrate and at the same time, through holes for forming the via hole electrodes 5 and 6 are created.

After that, a liquid conductive member such as a conductive paste is filled in each through hole via a squeegee and the mother ceramic green sheet laminate is cut in units of each substrate. Thus, the ceramic green sheet laminate in which the electrode material is filled in the cutaways 2e through 2h is obtained. When the ceramic green sheet laminate is sintered and then cooled, the electrode material filled in the cutaways 2e through 2h are baked and the external electrodes 11a through 11d are formed as the substrate 2 is sintered and the via hole electrodes 5 and 6 are baked.

Accordingly, the external electrodes 11a–11d are formed through the same process along with the via hole electrodes 5 and 6. Also, the electronic components 11c and 11d are formed so as to be electrically connected with a terminal electrode 7b located at the lower surface of the substrate 2. Accordingly, during surface-mounting of the component 10 on a printed circuit board or substrate or the like, the electronic component 10 may be joined to electrode lands of the printed circuit board or substrate or the like by connecting the external electrodes 11a–11d via soldering or the like. At this time, while a soldering fillet is formed to join the external electrodes 11a–11d with the electrode lands, the state of connection between the external electrodes 11a–11d and the electrode lands may be readily confirmed visually from outside of the component.

Figure 19A:
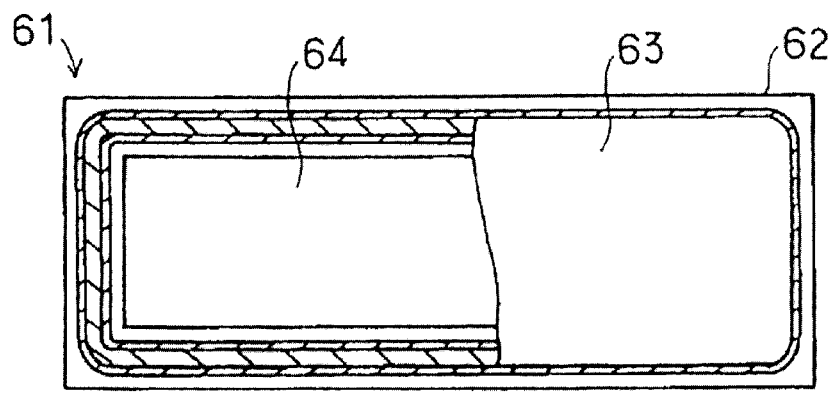
FIG. 19a is a partially cutaway plan view illustrating still another example of a prior art electronic component.
Figure 19B:
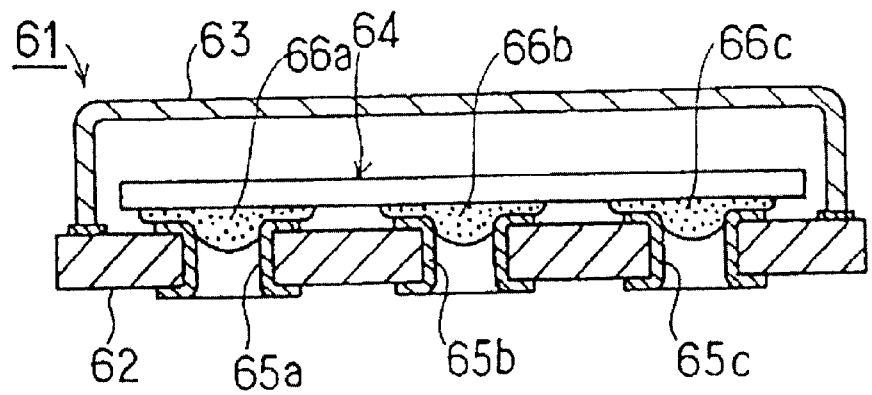
FIG. 19b is a partially cutaway section view illustrating another example of a prior art electronic component.

The electronic component 10 of the present preferred embodiment allows the state of connection when mounted on the printed circuit substrate or the like to be readily confirmed visually. Also, the size of the substrate is significantly reduced as compared to the prior art electronic component in which external electrodes are formed on the side of the substrate in the same manner with through hole electrodes (FIG. 19) by forming the external electrodes 11a–11d as described above. This will be explained with reference to FIGS. 5a, 5b, 6a and 6b.

Figure 5A:
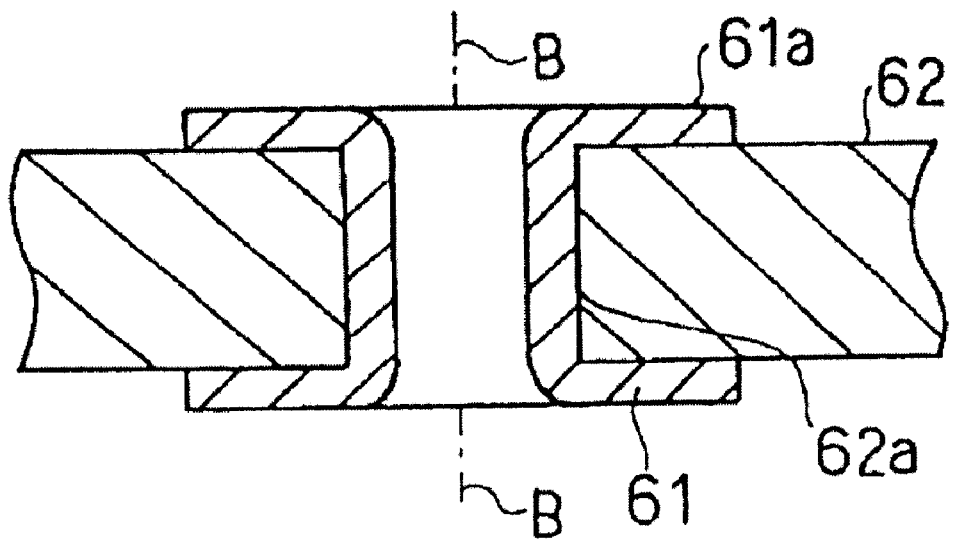
FIG. 5a is a partially cutaway section view illustrating a through hole electrode.

FIG. 5a is a partially cutaway section view showing a prior art through hole electrode. The through hole electrode 61 is formed by creating a through hole 62a through a substrate 62 and by applying an electrode material so as to extend to an inner peripheral portion and to upper and lower surfaces of the through hole 62.

Figure 5B:
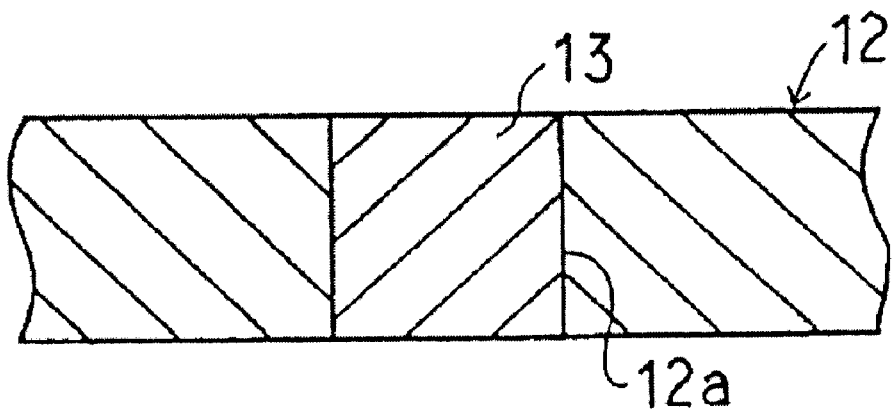
FIG. 5b is a partially cutaway section view for illustrating a via hole electrode.

However, the via hole electrode is formed by creating a through hole 12a through a mother substrate 12 and by filling an electrode material 13 within the through hole 12a as shown in FIG. 5b.

Figure 6A:
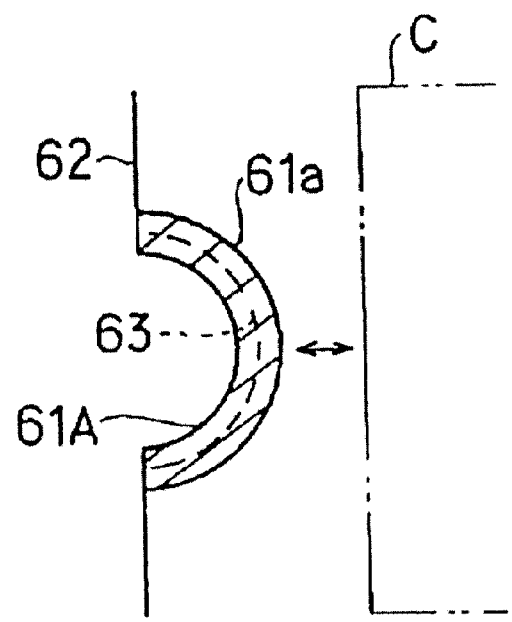
FIG. 6a is a schematic plan view illustrating a positional relationship between an external electrode and an electronic component having a through hole electrode.

Accordingly, when the through hole electrode 61 is formed and is cut at an alternate dotted line B in FIG. 5a to form a substantially semi-circular (in plan view) external electrode in the stage of the mother ceramic laminate, a flange portion 61a of the through hole electrode 61 is formed so as to extend to the inside more than a cutaway 63 at the upper and lower surfaces of the substrate 62 as shown in FIG. 6a.

Figure 6B:
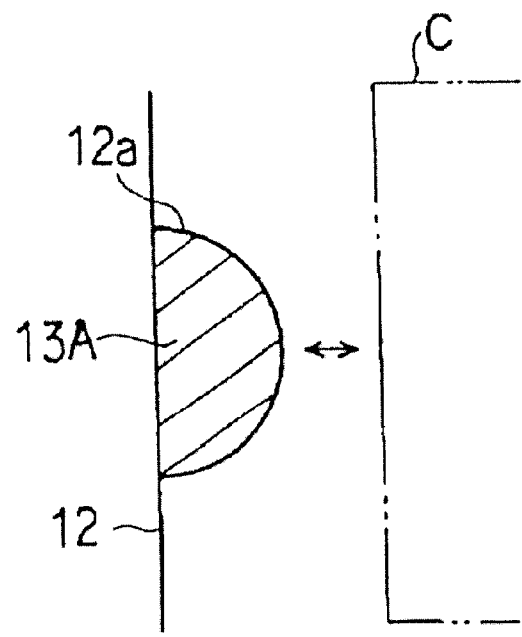
FIG. 6b is a schematic plan view illustrating a positional relationship between an external electrode and an electronic component having a via hole electrode.

When the external electrode 13A is formed as shown in FIG. 6b by cutting along the center of the via hole electrode 13, the external electrode 13A will not extend to the inside more than the cutaway 12a. Accordingly, when a distance between an inner edge of the external electrode 61A shown in FIG. 6a and an electronic component C mounted on the substrate 62 is made equal to a distance between an inner edge of the external electrode 13A in FIG. 6b and the electronic component C mounted on the substrate 12, the size of the substrate 12 which does not have the flange portion 61a may be reduced as compared to the substrate 62 by an amount equal to that portion. That is, the use of the external electrode 13A formed in the same manner along with the via hole electrode allows the substrate to be miniaturized as compared to the external electrode 61A formed in the same manner as the through hole electrode.

Accordingly, although the external electrodes 11a–11d are formed in the electronic component 10 shown in FIGS. 3 and 4, it allows the substrate 2 to be miniaturized or the electronic component 10 to be miniaturized as compared to the case of using the prior art external electrode formed in the same manner with the through hole electrode.

Figure 7:
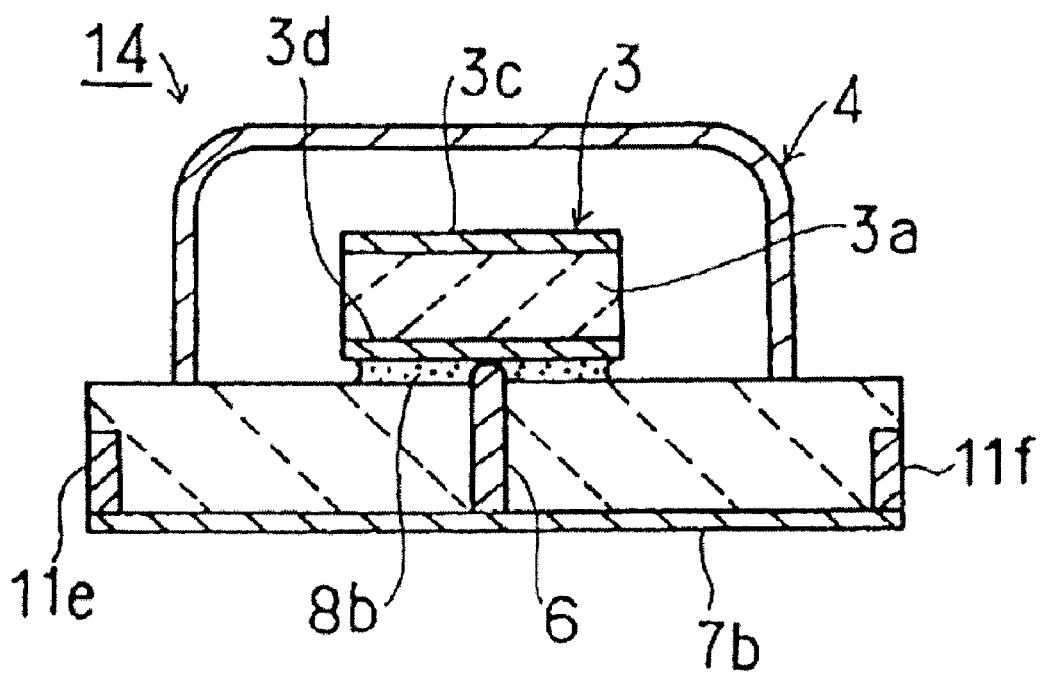
FIG. 7 is a transverse section view for explaining a modified example of the first preferred embodiment.

Although the external electrodes 11c and 11d which are formed on the side of the substrate 2 have been formed so as to protrude upwardly from the upper surface of the substrate 2 in the electronic component 10 shown in FIG. 3, external electrodes 11e and 11f which extend to an intermediate vertical position may be formed as shown in FIG. 7 instead of the external electrodes 11c and 11d. The state of connection of the electrode lands on the printed circuit substrate and the external electrodes 11e and 11f may be readily confirmed visually when the electronic component 14 is mounted on the printed circuit substrate or the like also when the external electrodes 11e and 11f are formed. Further, the substrate 2 may be miniaturized in the same manner as described above with reference to the second preferred embodiment.

The external electrodes 11e and 11f may be formed as follows. A first plurality of ceramic green sheets which corresponds to a ceramic layer on which the external electrodes 11e and 11f are to be formed are laminated on a support film to obtain a ceramic green sheet laminate by laminating the ceramic green sheets. At this time, through holes are created through each ceramic green sheet at a location where the external electrodes 11e and 11f are to be formed and a conductive member is injected to each through hole in advance. Then, the plurality of ceramic substrates are laminated while aligning the corresponding through holes to which the conductive member has been injected. Next, a second plurality of ceramic green sheets corresponding to the ceramic layer which is located above the upper end of the external electrodes 11e and 11f are laminated. Through holes are created through the second ceramic green sheets at the position where the via hole electrodes 5 and 6 are to be formed and a conductive member is filled in the through holes in advance of the lamination process.

Then, the substrate 2 on which the external electrodes 11e and 11f are formed may be obtained by cutting the mother ceramic green sheet laminate in units of each individual substrate and by sintering the laminate.

Figure 8A:
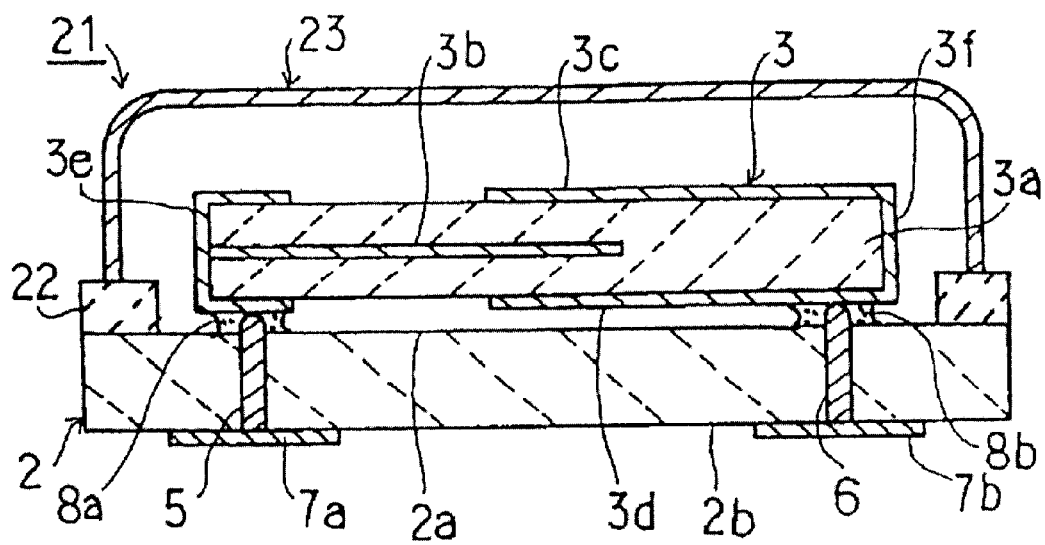
FIG. 8a is a longitudinal section view illustrating another modified example of the first preferred embodiment.
Figure 8B:
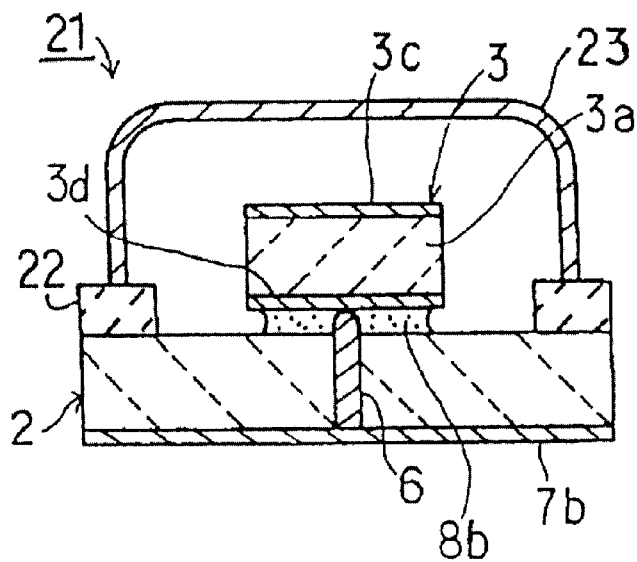
FIG. 8b is a transverse section view illustrating another modified example of the first preferred embodiment.

FIGS. 8a and 8b are longitudinal and transverse section views showing another modified example of the electronic component 1 of the first preferred embodiment.

Although the cap 4 has been fixed on the substrate 2 in the electronic component 1, the structure of the package for storing the electronic component may be changed as desired according to preferred embodiments of the present invention.

For example, a structure in which a substantially rectangular frame 22 is combined with a cap 23 may be used instead of the cap 4 as in the electronic component 21 shown in FIGS. 8a and 8b. Here, the substantially rectangular frame 22 preferably made of insulating ceramics such as alumina is fixed to the upper surface of the ceramic substrate by using insulating adhesive and the cap 23 made of metal or plastic is fixed on the frame 22. The other components are the same as those of the electronic component 1 shown in FIG. 1, so that the same parts are denoted by the same reference numerals and repetitive explanation thereof will be omitted here.

Figure 9A:
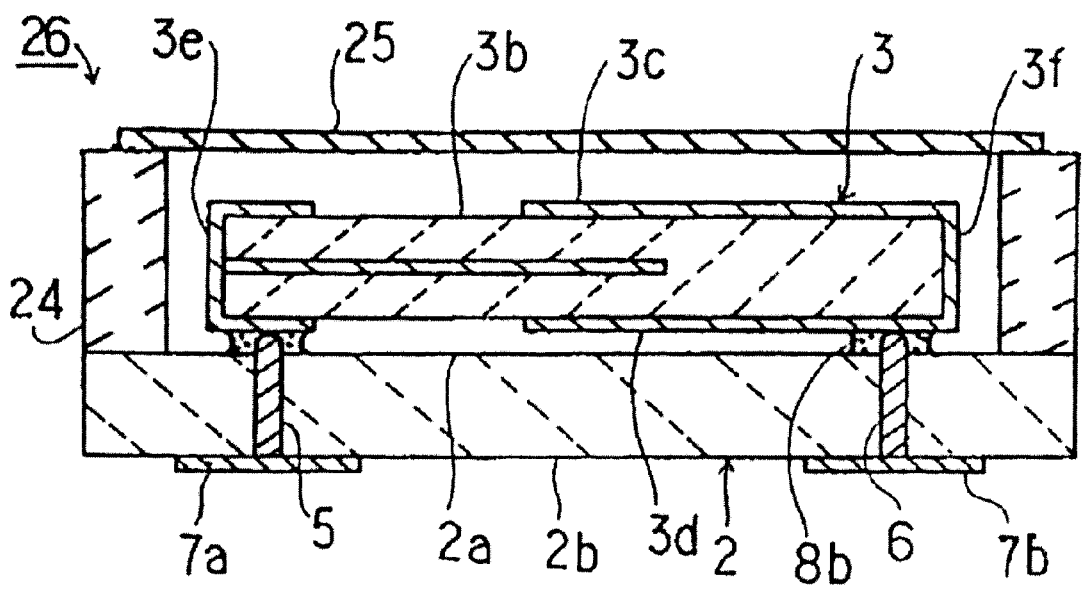
FIG. 9a is a longitudinal section view illustrating another modified example of the first preferred embodiment.
Figure 9B:
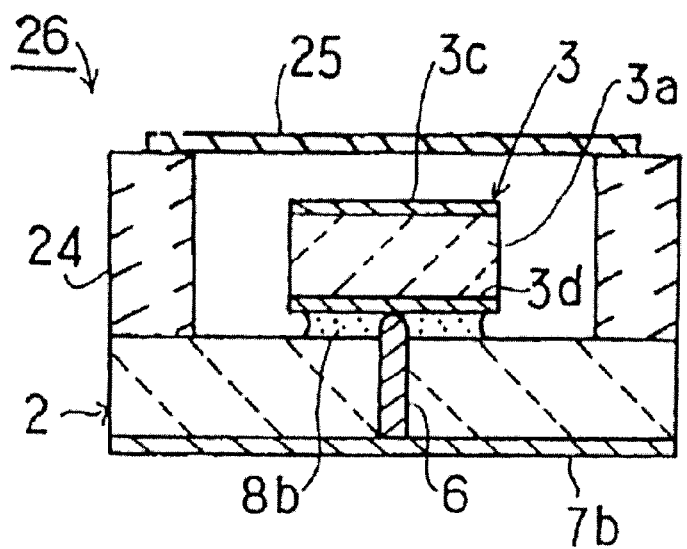
FIG. 9b is a transverse section view for explaining another modified example of the first preferred embodiment.

It is also possible to construct a package by using a frame 24 which is thicker than the piezoelectric resonator 3 and by fixing a plate-like lid 25 on the upper surface of the frame 24 as shown in FIGS. 9a and 9b. An electronic component 26 shown in FIGS. 9a and 9b is constructed in the same manner with as electronic component 1 except that the frame 24 and the plate-like lid 25 are used instead of the cap 4 (FIG. 1).

It is noted that the material composing the frame 24 and the cap 25 is not specifically limited. Further, the frame may be made of the same material with the substrate or may be sintered at the same time with the substrate.

Figure 10:
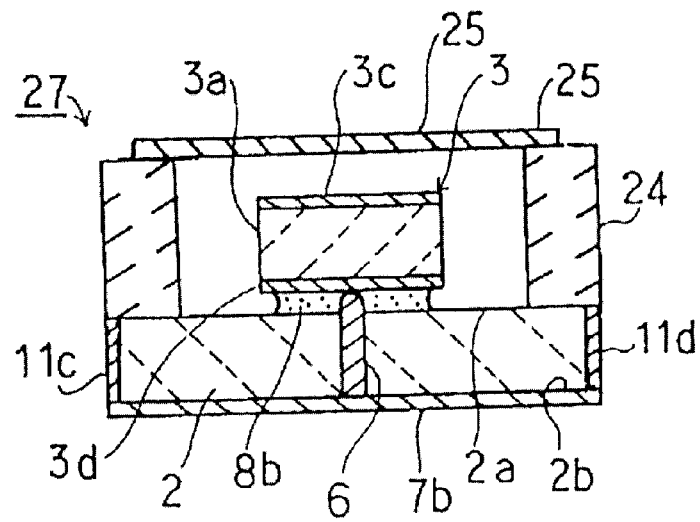
FIG. 10 is a transverse section view for explaining a modified example shown in FIG. 9b.

It is also possible to construct the component so as to be able to confirm the presence and physical characteristics of a fillet created by the solder or the like visually from the outside when mounted on a printed circuit substrate or the like by forming external electrodes 11c and 11d on the side of the ceramic substrate 2 like an electronic component 27 shown in a transverse section view of FIG. 10 in the same manner with the electronic component 10 shown in FIG. 3.

An electronic component according to a third preferred embodiment of the present invention will be explained with reference to FIGS. 11 through 15.

Figure 11:
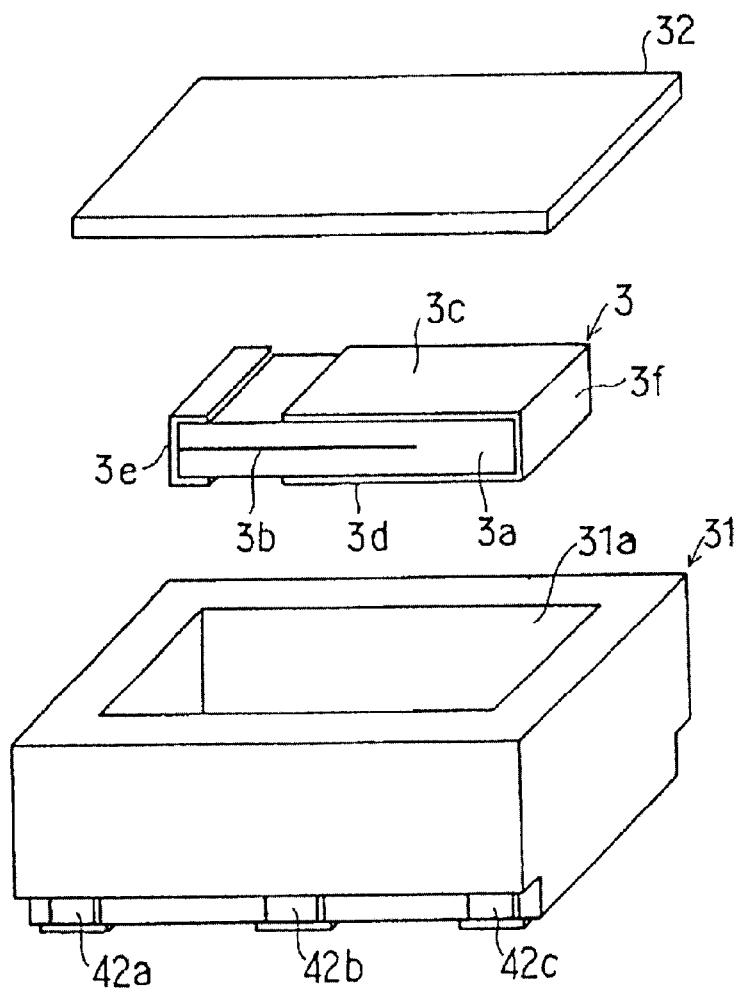
FIG. 11 is an exploded perspective view for explaining an electronic component according a third preferred embodiment of the present invention.

In the present preferred embodiment, the package preferably includes a substantially square package member 31 having an opening 31a at the upper part thereof and a plate-like lid 32 fixed so as to close the opening 31 as shown in an exploded perspective view of FIG. 11. A piezoelectric resonator 3 is stored within the package. The piezoelectric resonator 3 is constructed in the same manner as the piezoelectric resonator 3 shown in FIG. 1.

Figure 12:
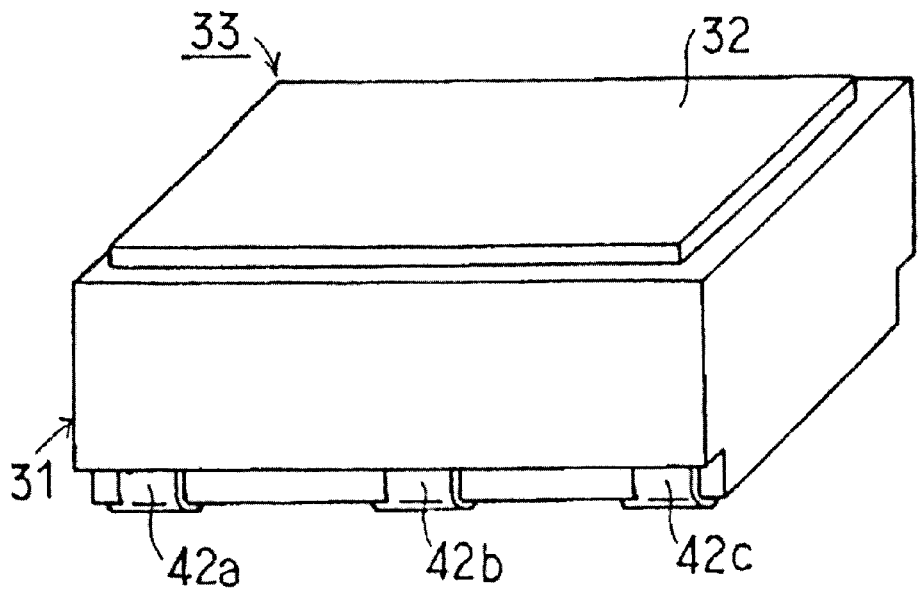
FIG. 12 is a perspective view showing an appearance of the electronic component of the third preferred embodiment.
Figure 13:
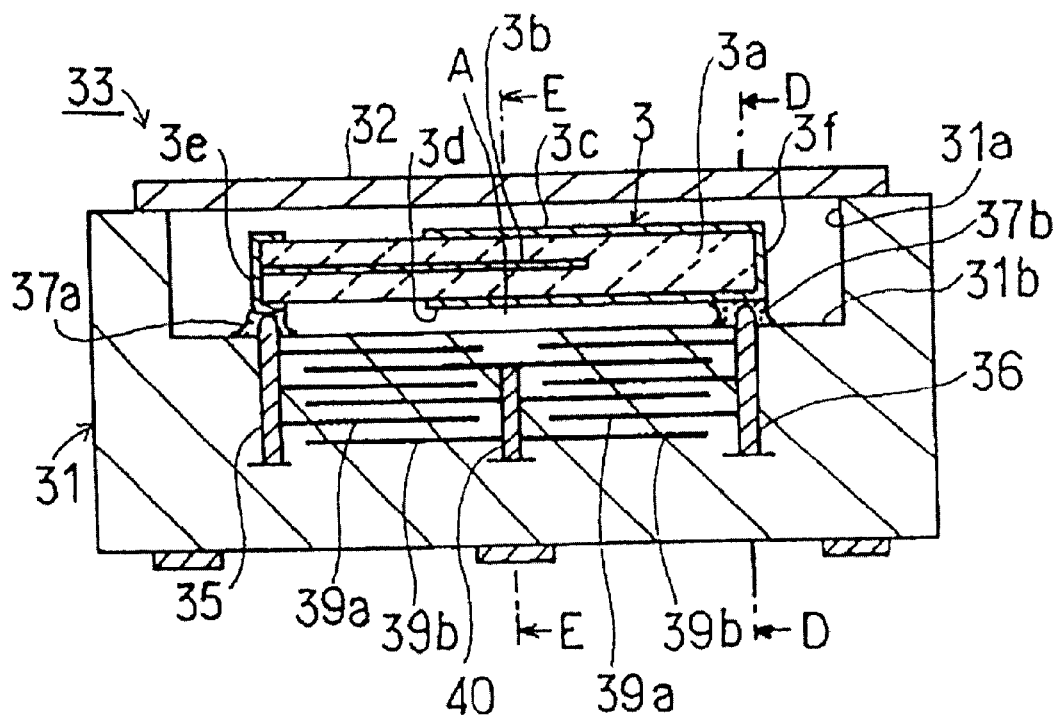
FIG. 13 is a longitudinal section view of the third preferred embodiment.
Figure 14:
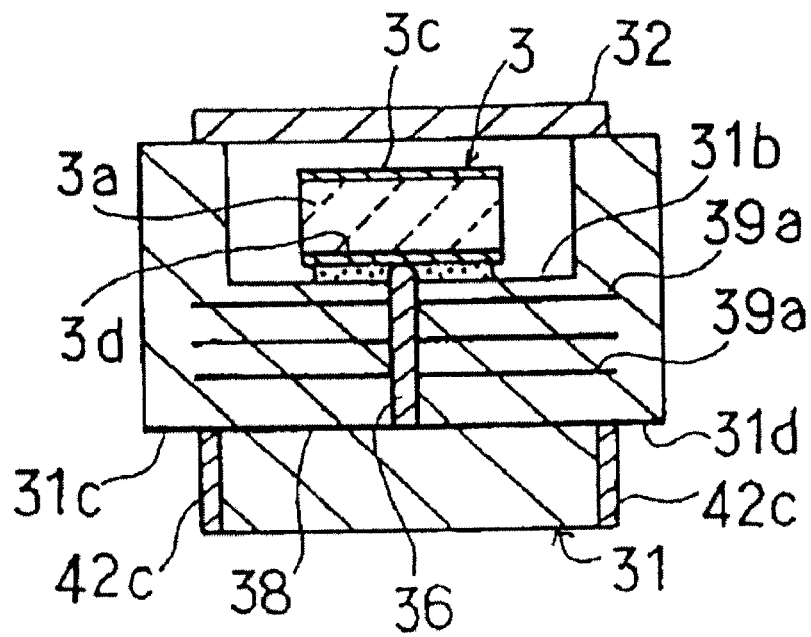
FIG. 14 is a section view along a line D—D in FIG. 13.
Figure 15:
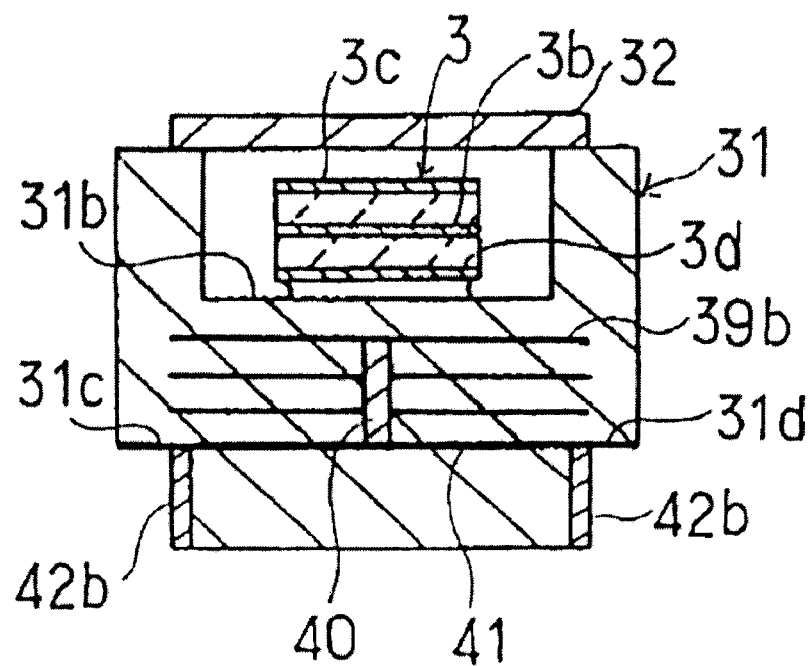
FIG. 15 is a section view corresponding to a portion along a line E—E in FIG. 13.

Accordingly, the electronic component 33 obtained in the present preferred embodiment has almost a substantially rectangular parallelepiped shape as shown in FIG. 12. FIG. 13 shows a longitudinal section view of the electronic component 33. FIG. 14 shows a transverse section view along an alternate dotted line D—D in FIG. 13 and FIG. 15 shows a section corresponding to a part along an alternate dotted line E—E in FIG. 13.

The package member 31 is preferably made of dielectric ceramics such as alumina. Via hole electrodes 35, 36 and 40 are formed through the package member 31 so as to penetrate through the ceramic layer. The via hole electrodes 35 and 36 protrude upward from an inner bottom 31b of the package member 31. Accordingly, the piezoelectric resonator 3 placed on the package member 31 is disposed so as to float from the inner bottom 31b while leaving a space A having a predetermined size or vertical dimension. Further, the piezoelectric resonator 3 is connected with the via hole electrodes 35 and 36 by conductive adhesives 37a and 37b.

Meanwhile, the package member 31 has steps 31c and 31d at one pair of sides facing to each other. As shown in FIG. 14, the via hole electrode 36 is extended to the vertical position where the steps 31c and 31d are created. A lower edge of the via hole electrode 36 is electrically connected with a connecting electrode 38 which is formed at the vertical position where the steps 31c and 31d are created.

A plurality of internal electrodes for composing capacitors are formed between the inner bottom 31b of the package member 31 and the step 31d. That is, a plurality of internal electrodes 39a connected to the via hole electrodes 35 and 36 and a plurality of internal electrodes 39b connected to the via hole electrode 40 are formed. The internal electrodes 39a and the internal electrodes 39b are disposed so as to overlap each other via the ceramic layers.

The via hole electrode 40 is connected to the uppermost one of the internal electrodes 39b and the upper edge thereof does not reach the inner bottom 31b as is apparent from FIG. 13. Meanwhile, the lower edge of the via hole electrode 40 extends to the vertical position where the steps 31c and 31d are formed and is electrically connected with a connecting electrode 41.

External electrodes 42a–42c are formed at the part below the steps 31c and 31d of the package member 31 on the sides thereof (see FIG. 11). The external electrodes 42 through 42c are formed on the pair of sides facing each other.

As shown in FIG. 14, the external electrodes 42c are electrically connected with a connecting electrode 38 and consequently, are electrically connected with the via hole electrode 36. Meanwhile, the external electrodes 42b and 42b are connected with the connecting electrode 41 and consequently, are electrically connected with a via hole electrode 40 as shown in FIG. 15.

Therefore, a circuit structure in which the piezoelectric resonator and two capacitors are connected between the external electrodes 42a through 42c may be realized in the electronic component 33 of the present preferred embodiment.

As described above, the electronic component of the present preferred embodiment of the present invention permits the capacitors including the plurality of internal electrodes to be constructed within the package member. In this case, a desired circuit may be structured by electrically connecting the plurality of internal electrodes with the via hole electrodes.

Because the electronic component 33 of the present preferred embodiments has the circuit structure in which the piezoelectric resonator and two capacitors are connected as described above, it may be suitably used as a piezoelectric resonator for example.

Figure 16A:
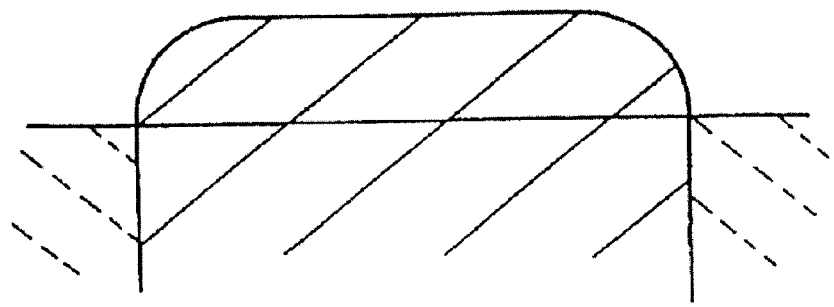
FIG. 16a is a section view for illustrating a via hole electrode having an elliptic plan shape is elliptic.
Figure 16B:
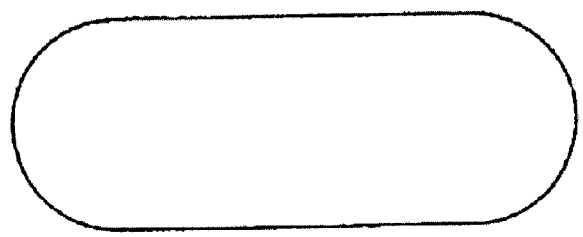
FIG. 16b is a plan view illustrating a via hole electrode having an elliptic plan shape.
Figure 17:
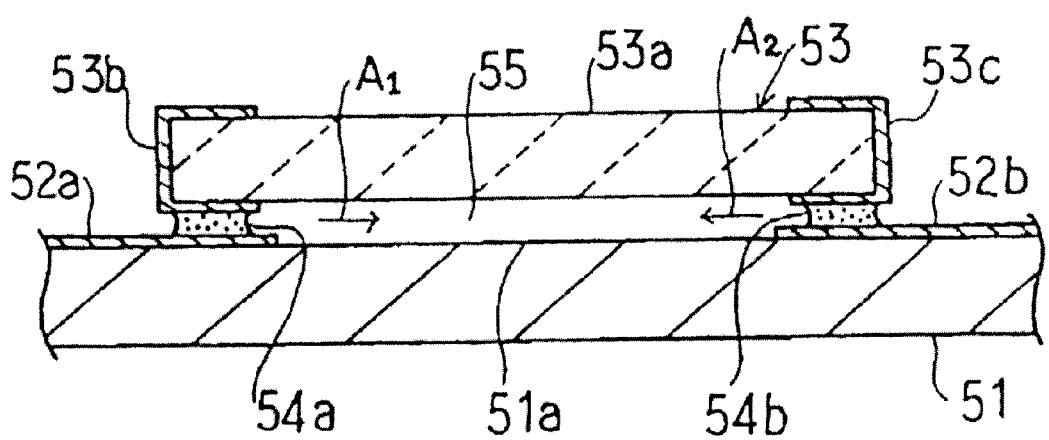
FIG. 17 is a section view illustrating a prior art electronic component.
Figure 18:
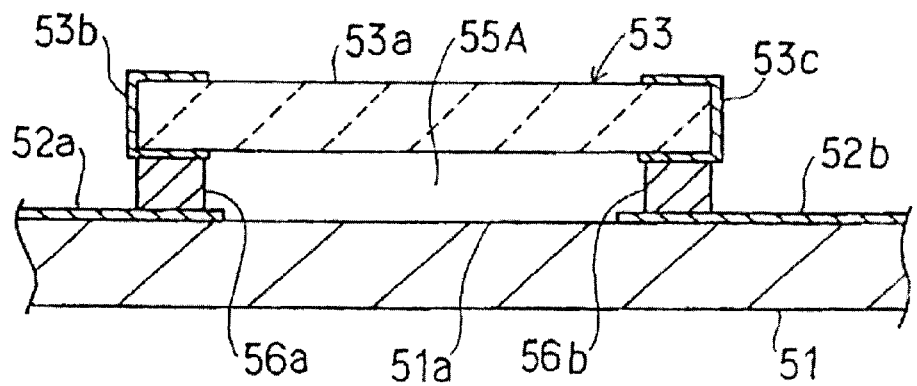
FIG. 18 is a partially cutaway section view illustrating another example of a prior art electronic component.

Although the via hole electrode having a substantially circular transverse section has been shown in the above-mentioned preferred embodiment, the sectional profile of the via hole electrode is not limited to a substantially circular shape in the present invention. For instance, the section of a via hole electrode 42 may be substantially elliptical as shown in FIGS. 16a and 16b. In such a case, an electronic component may be stably located via member 42a protruding from a package member 43. The sectional profile of the via hole electrode is not limited to the substantially elliptical shape and may assume any shape such as a substantially rectangular or substantially square shape.

Further, it is possible to support an electronic component more stably by disposing a plurality of via hole electrodes in close proximity.

While the invention has been particularly shown and described with reference to preferred embodiments thereof, it will be understood by those skilled in the art that the forgoing and other changes in form and details may be made therein without departing from the spirit of the invention.

What is claimed is:

1. An apparatus, comprising:
   a substrate made of ceramic material;
   a plurality of via holes provided in the substrate;
   at least one via hole electrode provided in at least one of the plurality of through holes and comprising a solid member made of a conductive electrode material and which completely fills the at least one of the through holes and extends through the at least one through hole in the substrate so as to protrude by a protruding amount from a first surface of the substrate;
   an electronic component located on the first surface of the substrate with a space defined between the first surface of the substrate and the electronic component, the space between the electronic component and the first surface of the substrate being determined by the protruding amount of the via hole electrode protruding from the surface of the substrate, the via hole electrode being in contact with the first surface of the electronic component; and
   a conductive adhesive electrically connecting the electronic component with the at least one via hole electrode; wherein
   the conductive adhesive extends between the substrate and the electronic component, is in contact with the protruding amount of the via hole electrode, the substrate and the electronic component, and substantially surrounds the protruding amount of the via hole electrode protruding from the surface of the substrate; and
   wherein the coefficient of thermal contraction of the ceramic material of the substrate is higher than the coefficient of thermal contraction of the conductive electrode material filled in the at least one of the through holes by about 1% to about 20%.

2. The electronic component according to claim 1, further comprising a plurality of via hole electrodes each provided in a respective one of the plurality of through holes and each comprising a solid member which completely fills the respective one of the through holes and extends through the respective one of the through holes in the substrate so as to protrude by a protruding amount from a first surface of the substrate.

3. The electronic component according to claim 1, further comprising a terminal electrode connected to the at least one via hole electrode at a second surface of the substrate which is opposite to the first surface of the substrate.

4. The electronic component according to claim 3, wherein the terminal electrode is arranged to be substantially perpendicular to the at least one via hole electrode.

5. The electronic component according to claim 1, wherein the electronic component is a piezoelectric resonator.

6. The electronic component according to claim 1, wherein the at least one via hole electrode is exposed at a second surface of the substrate; and the first and the second surfaces of the substrate are opposite to each other.

7. The electronic component according to claim 1, wherein a plurality of internal electrodes are provided in the substrate to define at least one capacitor, and the least one via hole electrode is electrically connected to the capacitor.

8. The electronic component according to claim 1, wherein a plurality of cutaways are provided on a side of the ceramic substrate, and a plurality of external electrodes are provided in the plurality of cutaways.

9. The electronic component according to claim 1, wherein the joining member comprises an adhesive material located between the electronic component and the at least one via hole electrode.

10. The electronic component according to claim 1, wherein the at least one via hole electrode comprises a substantially rod-shaped member.

11. The electronic component according to claim 1, wherein the at least one via hole electrode includes a protruding portion which protrudes from the via hole above the first surface of the substrate in a direction that is substantially perpendicular to the first surface of the substrate.

12. The electronic component according to claim 1, wherein the at least one via hole electrode includes a protruding portion which does not extend along the first surface of the substrate.

* * * * *